United States Patent
Sudo

(10) Patent No.: US 10,896,736 B2
(45) Date of Patent: Jan. 19, 2021

(54) SEMICONDUCTOR MEMORY DEVICE AND NAND-TYPE FLASH MEMORY ERASE METHOD

(71) Applicant: Winbond Electronics Corp., Taichung (TW)

(72) Inventor: Naoaki Sudo, Taichung (TW)

(73) Assignee: WINBOND ELECTRONICS CORP., Taichung (TW)

(*) Notice: Subject to any disclaimer, the term of this patent is extended or adjusted under 35 U.S.C. 154(b) by 78 days.

(21) Appl. No.: 16/279,167

(22) Filed: Feb. 19, 2019

(65) Prior Publication Data

US 2019/0272879 A1  Sep. 5, 2019

(30) Foreign Application Priority Data

Mar. 5, 2018  (JP) .................................. 2018-038605

(51) Int. Cl.
*G11C 16/14*  (2006.01)
*G11C 16/04*  (2006.01)
*G11C 16/30*  (2006.01)
*G11C 16/08*  (2006.01)
*G11C 16/26*  (2006.01)

(52) U.S. Cl.
CPC .......... *G11C 16/14* (2013.01); *G11C 16/0483* (2013.01); *G11C 16/08* (2013.01); *G11C 16/26* (2013.01); *G11C 16/30* (2013.01)

(58) Field of Classification Search
CPC .................................................... G11C 16/14
See application file for complete search history.

(56) References Cited

U.S. PATENT DOCUMENTS

| 6,452,840 | B1* | 9/2002 | Sunkavalli | ........... | G11C 16/344 |
| | | | | | 365/185.29 |
| 9,142,305 | B2 | 9/2015 | Dunga et al. | | |
| 2006/0239111 | A1* | 10/2006 | Shingo | .................... | G11C 16/16 |
| | | | | | 365/230.09 |
| 2007/0140015 | A1 | 6/2007 | Kawamura | | |
| 2015/0287479 | A1 | 10/2015 | Nam et al. | | |
| 2016/0064086 | A1* | 3/2016 | Hung | ..................... | G11C 16/14 |
| | | | | | 365/185.23 |

FOREIGN PATENT DOCUMENTS

| JP | 2012027979 A | 2/2012 |
| TW | 201324513 A | 6/2013 |

* cited by examiner

*Primary Examiner* — Douglas King
(74) *Attorney, Agent, or Firm* — Muncy, Geissler, Olds & Lowe, P.C.

(57) ABSTRACT

The present invention provides a semiconductor memory device capable of performing rapid erasing while reducing power consumption. In the flash memory of the present invention, the voltage of the P well is detected by the voltage detecting unit 200 during the erasing operation. When the voltage is lower than the threshold value, it is determined that the off leakage current of the selection transistor of the non-selection block is large, and the voltage of the global word line at the time of applying the next erase pulse is increased. When the voltage is above the threshold value, it is determined that the off leakage current is small, and the voltage of the global word line at the time of applying the next erase pulse is maintained.

16 Claims, 5 Drawing Sheets

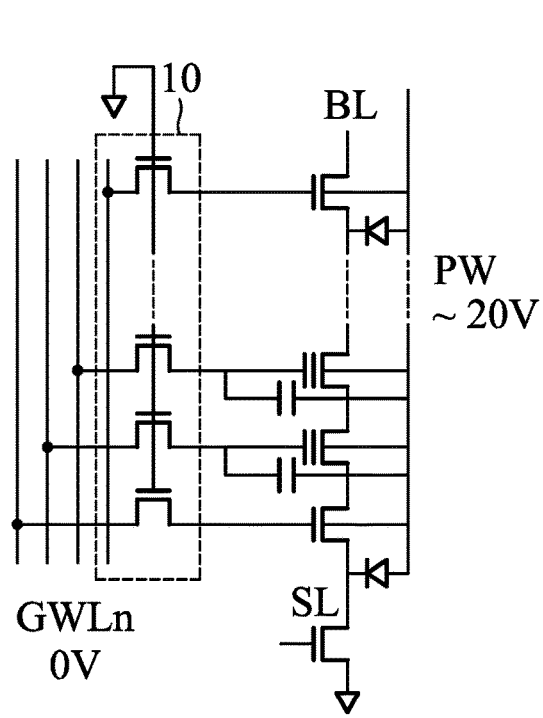
Fig. 1(A) Unselected block
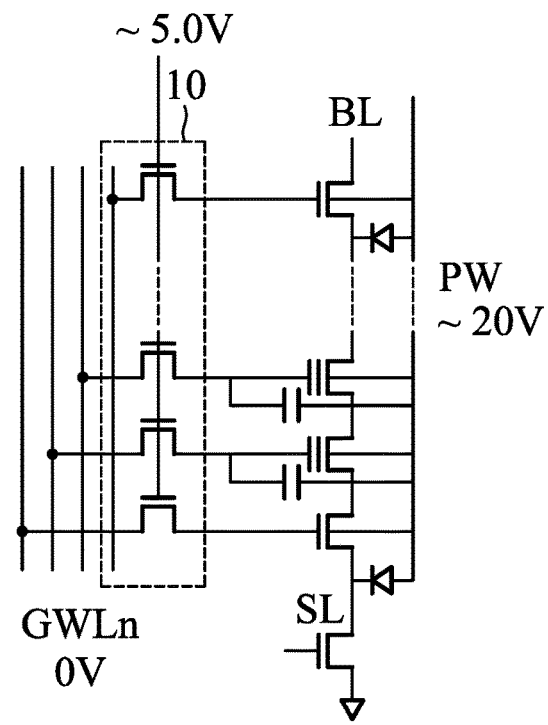
Fig. 1(B) Selected block
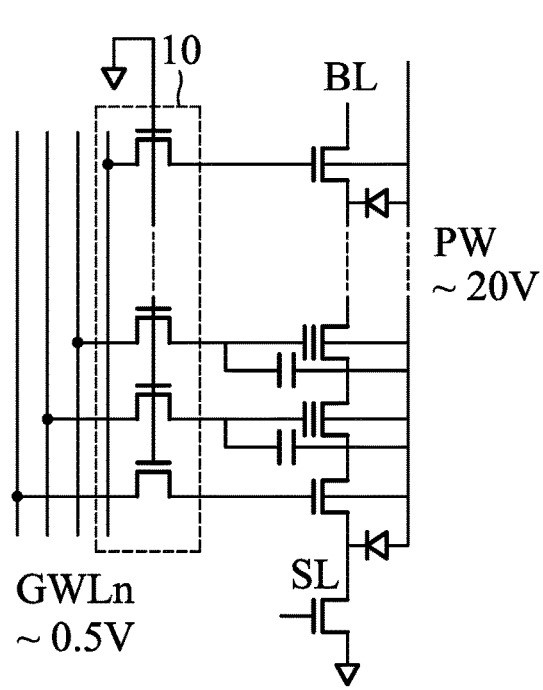
Fig. 2(A) Unselected block
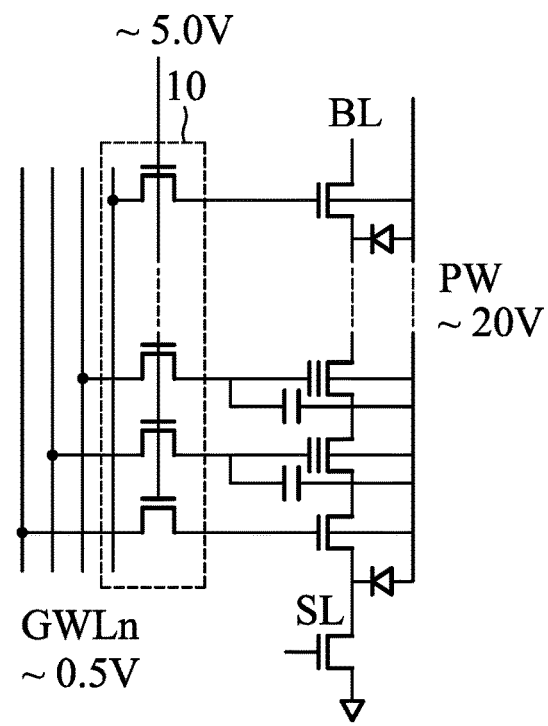
Fig. 2(B) Selected block

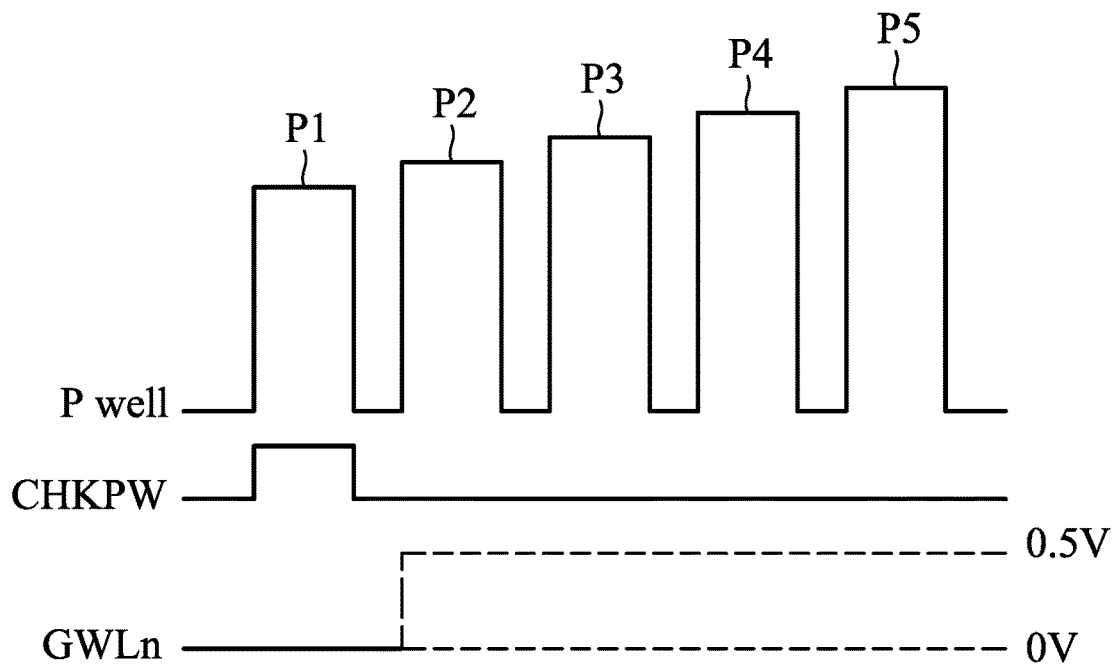
FIG. 5
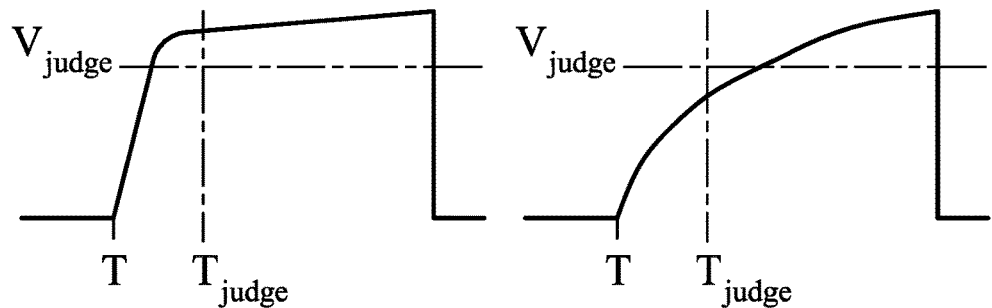
FIG. 6(A)   FIG. 6(B)
| the voltage Vjudge of the P well | the voltage of GWLn |
|---|---|
| $V_{judge} < Th1$ | 0.5V |
| $Th1 \leq V_{judge} < Th2$ | 0.3V |
| $V_{judge} \geq Th2$ | 0V |
FIG. 7

SEMICONDUCTOR MEMORY DEVICE AND NAND-TYPE FLASH MEMORY ERASE METHOD

CROSS REFERENCE TO RELATED APPLICATIONS

This Application claims priority of Japanese Patent Application No. 2018-038605, filed on Mar. 5, 2018, the entirety of which is incorporated by reference herein.

BACKGROUND OF THE INVENTION

Field of the Invention

The present invention relates to a semiconductor memory device and in particular to a method for erasing a flash memory.

Description of the Related Art

In the erase operation of a NAND flash memory, the source/drain is maintained in a floating state, a reference potential is applied to the control gate (word line), and an erase voltage is applied to the P well. In this way, the data in the selected block of the memory cell array is erased all at once. Generally, data is erased according to ISPE (Incremental Step Pulse Erase), and an erase pulse is applied to the selection block. If the erase verification fails, a higher erase pulse than the previous one is applied for the erase operation (Patent Document 1).

Patent Document 1: Japanese Patent Publication No. 2012-027979

A row selection/drive circuit (XDEC) includes a plurality of selection transistors 10 connected to respective word lines of the blocks of the memory cell array, and turns on or off the select transistors 10 according to the input address to perform block selection or non-selection. In cases where the block is not selected, as shown in FIG. 1(A), the gate of the selection transistor 10 is applied with, for example, 0V, and the selection transistor 10 is turned off, whereby the non-selected word line WL of the non-selected block becomes a floating state. On the other hand, in cases where the block is selected, as shown in FIG. 1(B), 5.0V, for example, is applied to the gate of the selection transistor 10, the selection transistor 10 is turned on, and 0V is applied to the selected word line WL of the selection block. Also, the row selection/drive circuit supplies 0V to the global word line GWLn connected to the source/drain of the select transistor 10.

In the NAND flash memory, the P well is shared by all the blocks on one plane, and a high erase voltage (for example, ~20V) is applied to the P well. During the erase period, the non-selected word lines WL of the non-selected block are floating, and because the high erase voltage is coupled to the P well, the non-selected block is prevented from being erased. 0V is applied to the selected word line WL of the selected block, and the charges of the floating gate are discharged to the P well by the high erase voltage of the P well.

The selection transistor 10 is composed of a transistor that is driven by a high voltage and supplies a high program voltage to the selected word line WL during a program operation. The threshold voltage of the transistor driven by the high voltage is higher than that of the transistor driven by the low voltage, and a slight leakage current Ioff is generated even in the off state due to the influence of miniaturization and narrow pitch of wiring. For example, as shown in FIG. 1(B), even if the source (global word line GWLn) is 0V and the gate voltage is 0V, the off-leakage current Ioff flows into the selection transistor 10. When the off-leakage current Ioff flows, the non-selected word line WL cannot maintain the high-impedance state, and the bonding level with the P-well becomes insufficient. This causes erase disturbance of the non-selected blocks.

Furthermore, since the off-leakage current Ioff of the selection transistor 10 causes the capacitance of the P well to be greater than originally expected, the rise of the erase voltage applied to the P well is slowed down. This will eventually cause problems with timeout of the erasing time.

In order to avoid this phenomenon, a method of biasing the global word line GWLn used as the source of the selection transistor 10 to a certain level is used. For example, as shown in FIG. 2, the global word line GWLn is biased to 0.5V. In this state, the off-leakage current Ioff of the selection transistor 10 may be reduced. However, this bias level can also be used to the selected word line WL of the selected block. That is to say, it means that the potential difference between the P well and the selected word line WL of the selected block is reduced, and the erase speed becomes slow. A higher voltage level of the global word line GWLn will reduce the off-leakage current Ioff, but will slow down the erase speed. Moreover, a lower voltage level of the global word line GWLn can maintain a large erase bias voltage for high-speed erasing, but increases the off-leakage current Ioff. Therefore, it is important to use a voltage level of the global word line GWLn that is optimized in response to the off-leakage current Ioff of the selection transistor 10.

The purpose of the present invention is to solve the aforementioned conventional problem and to provide a semiconductor memory device capable of rapidly erasing while reducing power consumption.

BRIEF SUMMARY OF THE INVENTION

A detailed description is given in the following embodiments with reference to the accompanying drawings.

An erase method for NAND-type flash memory of the invention, including: based on address information, applying a first voltage to the gate of a first selection transistor connected to each word line of a memory cell to select a block, applying a second voltage to the gate of a second selection transistor connected to each word line of the memory cell to unselect a block, and applying a third voltage to the source/drain of the first and second selection transistors; detecting voltage of a well region when an erase pulse is applied; and controlling a third voltage based on the detected voltage.

Another erase method for NAND-type flash memory of the invention, including: based on address information, applying a first voltage to the gate of a first selection transistor connected to each word line of a memory cell to select a block, applying a second voltage to the gate of a second selection transistor connected to each word line of the memory cell to unselect a block, and applying a third voltage to the source/drain of the first and second selection transistors; detecting off-leakage current of the selection transistor when an erase pulse is applied; and controlling a third voltage based on the detected off-leakage current.

A semiconductor memory device of the invention, including: a memory cell array comprising a plurality of memory cells; a selection member comprising a selection transistor connected to each word line of the plurality of memory cells, wherein according to address information, the selection member applies a first voltage to the gate of a first selection transistor to select a block, and applies a second voltage to the gate of a second selection transistor to unselect a block; an erase member applying a third voltage to the source/drain of the first and second selection transistors, and applying an erase voltage to a well region to erase a selected block. The erase member further includes: a detection member detecting the voltage of the well region after the erase pulse is applied; and a control member controlling the third voltage based on the voltage detected by the detection member.

According to the present invention, the voltage of the well region is detected, and the third voltage applied to the source/drain of the selection transistor for selecting a block is controlled based on the detected voltage. Therefore, it is possible to rapidly increase the erase voltage of the well region while suppressing the off-leakage current of the selection transistor. Thereby, the power consumption during the erase operation can be reduced, and the erasing time can be shortened.

BRIEF DESCRIPTION OF THE DRAWINGS

The present invention can be more fully understood by reading the subsequent detailed description and examples with references made to the accompanying drawings, wherein:

FIG. 1(A) shows a bias condition of a non-selected block when a conventional flash memory is erased;

FIG. 1(B) shows a bias condition of a selected block when a conventional flash memory is erased;

FIG. 2(A) is a diagram showing another example of bias condition of a non-selected block of a conventional flash memory during an erase operation;

FIG. 2(B) is a diagram showing another example of bias condition of a selected block of a conventional flash memory during an erase operation;

FIG. 5 is a diagram showing an erase sequence in accordance with the first embodiment of the present invention;

FIG. 6(A) shows an example of a rising waveform of the erase voltage applied to the P well when the off-leakage current does not exceed the threshold value;

FIG. 6(B) shows an example of a rising waveform of the erase voltage applied to the P well when the off-leakage current exceeds the threshold value;

FIG. 7 is shows a method of determining the voltage of the global word line in accordance with the second embodiment of the present invention;

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Next, an embodiment of the present invention will be described in detail with reference to the drawings. Here, a preferred embodiment would be a NAND-type flash memory.

Figure 3:
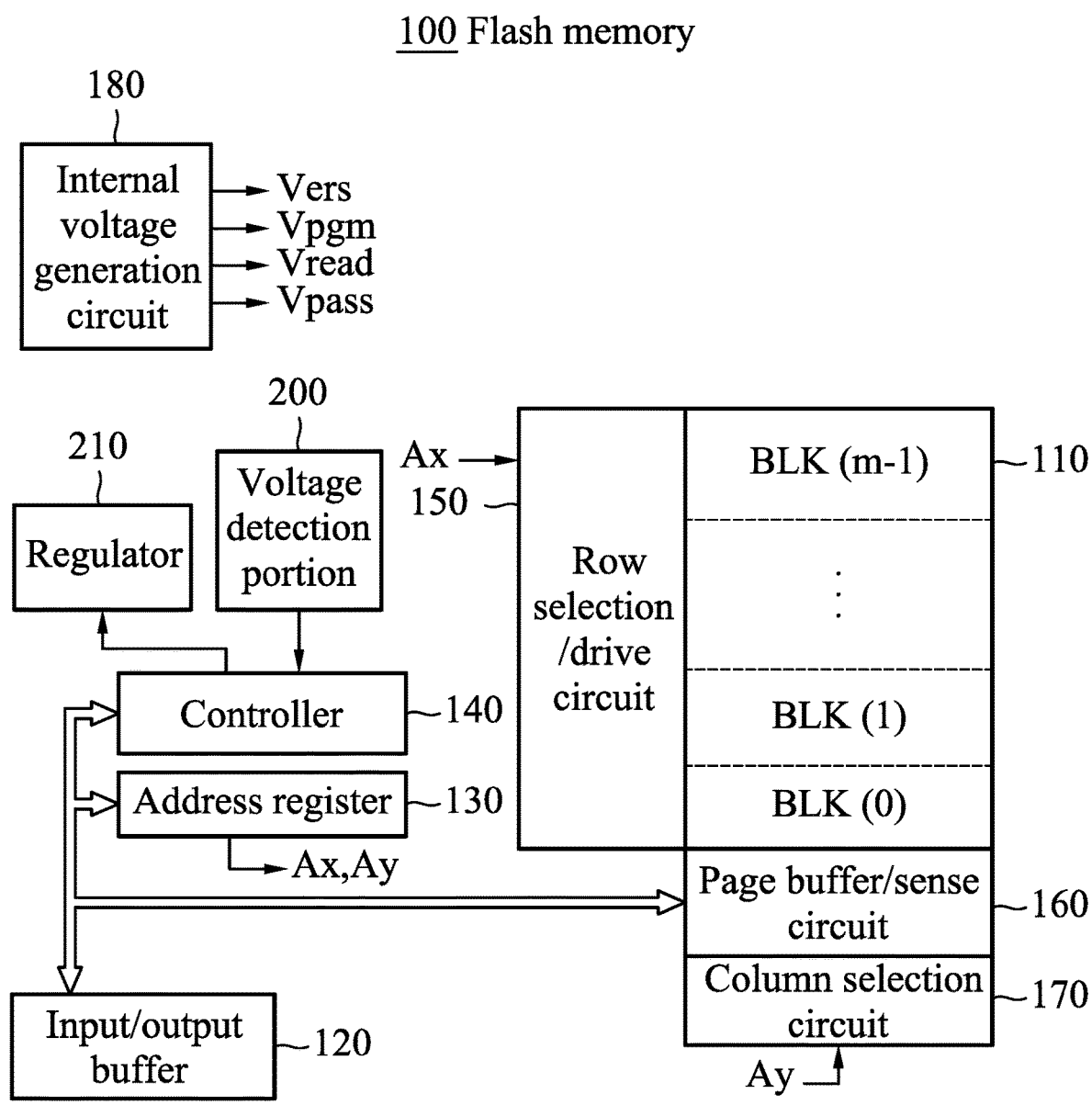
FIG. 3 is a block diagram showing the architecture of a flash memory in accordance with an embodiment of the present invention.

FIG. 3 shows the architecture of the flash memory of the embodiment of the present invention. The flash memory 100 of the present embodiment includes: a memory array 110, an input/output buffer 120, an address register 130, a controller 140, a row selection/drive circuit 150, a page buffer/sense circuit 160, a column selection circuit 170, and an internal voltage generation circuit 180. The memory array 110 is formed by a plurality of memory cells arranged in a matrix. The input/output buffer 120 is connected to an external input/output terminal I/O. The address register 130 receives address data from the input/output buffer 120. The controller 140 receives instruction data from the input/output buffer 120 to control each portion. The row selection/drive circuit 150 receives the row address information Ax from the address register 130, decodes the row selection information Ax, and performs block selection, word line selection, etc. according to the decoding result. The page buffer/sense circuit 160 holds the data read from the page selected by the row selection/drive circuit 150 and the data to be programmed to the selected page. The column selection circuit 170 receives the column address information Ay from the address register 130, decodes the column address information. Ay, and selects the data of the column address in the page buffer/sense circuit 160 according to the decoding result. The internal voltage generation circuit 180 generates various voltages required for reading, programming, erasing, etc. of the data (program voltage Vpgm, pass voltage Vpass, read pass voltage Vread, erase voltage Vers, etc.).

The memory array 110 has m memory blocks BLK(0), BLK(1), . . . , BLK(m−1) in the column direction. One memory block includes a plurality of NAND strings, and one NAND string includes a plurality of memory cells, a bit line side selection transistor, and a source line side selection transistor.

In the read operation, a positive voltage is applied to the bit line, 0V is applied to the selected word line, a pass voltage is applied to the unselected word line, the bit line side selection transistor and the source line side selection transistor are turned on, and 0V is applied to the common source line. In the program operation, a high program voltage Vpgm is applied to the selected word line, an intermediate potential is applied to the unselected word line, the word line side selection transistor is turned on, the source line side selection transistor is turned off, the potential corresponding to the data of 0" or "1" is supplied to the bit line GBL. In the erase operation, 0V is applied to the selected word line in the block, a high voltage is applied to the P well, and the electrons of the floating gate are extracted to the substrate, thereby erasing the data in units of blocks.

Figure 4:
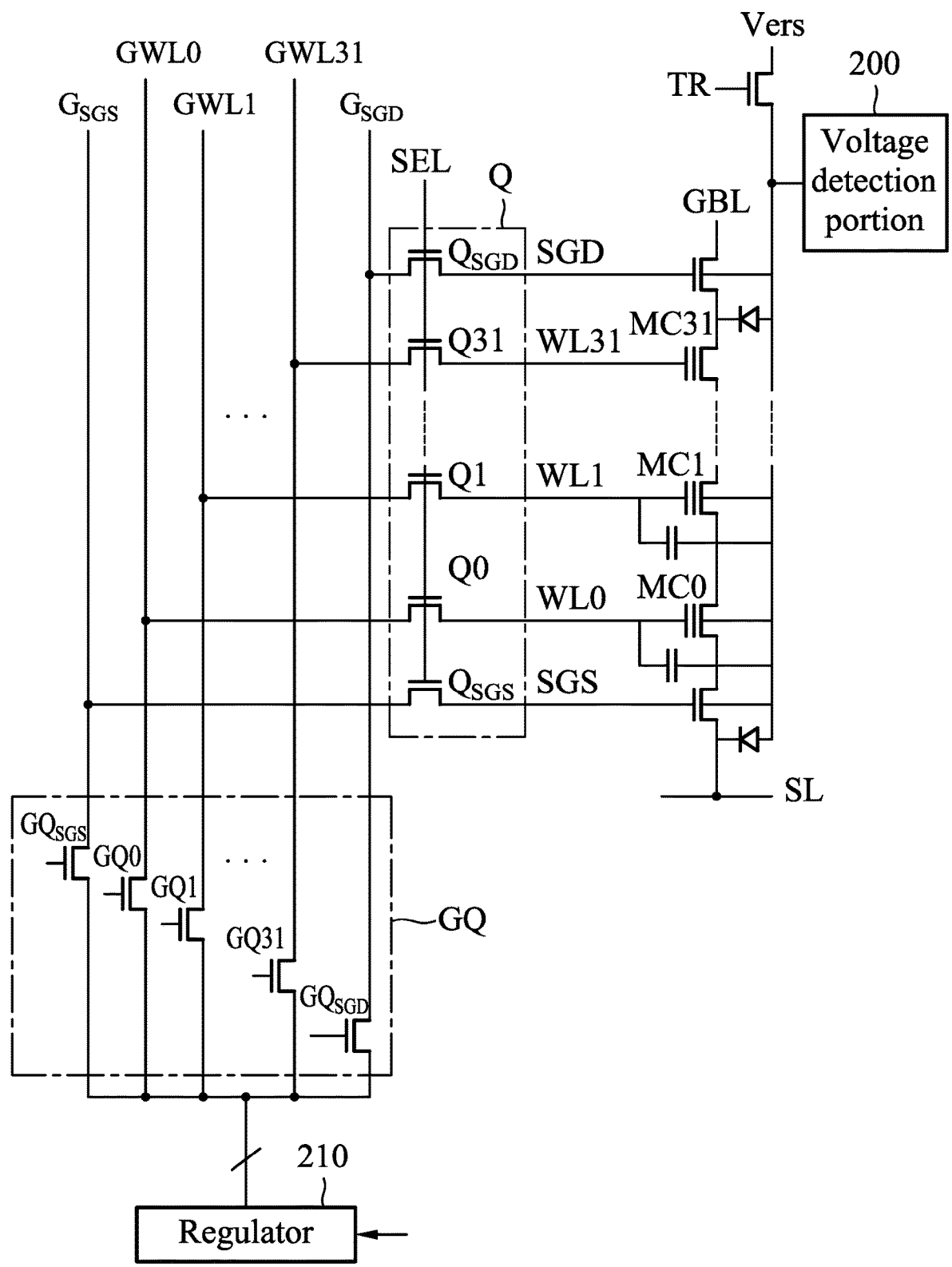
FIG. 4 is a diagram showing the details of a row selection/drive circuit in accordance with an embodiment of the present invention.

Referring to FIG. 4, however, it must be noted here that the representative of the memory cell array is exemplified by one NAND string connected to one global bit line GBL. For example, one NAND string has a structure in which memory cells MC0 to MC31, a bit line side selection transistor, and a source line side selection transistor are connected in series.

In one embodiment, the row selection/drive circuit 150 includes a voltage detection portion 200 for detecting a voltage of a P well forming the memory cell array. When the voltage detection portion 200 performs the erase operation, the voltage of the P well is detected at the determined time point, and the detection result is supplied to the controller 140. The controller 140 controls a regulator 210 based on the detected voltage of the P well.

Each of the word lines WL0 to WL31 of the memory cell array, the gate line SGD of the bit line side selection transistor, and the gate line SGS of the source line side selection transistor are respectively connected to high-voltage driven selection transistors Q0 to Q31, $Q_{SGD}$, and $Q_{SGS}$ (these transistors can be referred to as selection transistors Q).

The row selection/drive circuit 150 decodes the row address Ax, applies a selection signal SEL to the gate of the selection transistor Q (for example, 5V for selecting a block; 0V for not selecting a block), and selects a word line and a block of the memory cell array. The selection transistors Q0 to Q31 are connected to the global word lines GWL0 to 31, respectively, and the selection transistors $Q_{SGD}$ and $Q_{SGS}$ are connected to a global bit line side selection line $G_{SGD}$ and a global source line side selection line $G_{SGS}$, respectively.

The global word lines GWL0 to 31, the global bit line side selection line $G_{SGD}$, and the global source line side selection line $G_{SGS}$ are connected to the regulator 210 via global selection transistors CQ0 to CQ31, $CQ_{SGD}$, and $CQ_{SGS}$, respectively (these transistors can be referred to as global selection transistors GQ). The global selection transistor GQ is selectively turned on or off in response to the action of the flash memory by the control of the controller 140.

The regulator 210 uses the voltage generated by the internal voltage generation circuit 180 and applies the driving voltages corresponding to the operating state of the flash memory to the global word line GWL0 to 31, the global bit line side selection line $G_{SGD}$, and the global source line side selection line $G_{SGS}$ via the global selection transistors GQ according to the control of the controller 140.

Next, the erase operation of the flash memory according to the present embodiment will be described. When an erase command and address information are input from the outside, the controller 140 interprets the erase command and controls the erase sequence. The row selection/drive circuit 150 decodes the row address and performs block selection or non-selection by the selection signal SEL according to the decoding result.

Furthermore, the regulator 210 supplies, for example, GND (0V) to the global word lines GWL0 to 31, the global bit line side selection line $G_{SGD}$, and the global source line side selection line $G_{SGS}$, and the global selection transistor GQ is switched on by the controller 140. Thereby, the selected word line WL of the selected block is supplied with GND via the selection transistor Q, and the non-selected word line WL of the non-selected block becomes a floating state because the selection transistor Q is in a non-conductive state. Next, the P well forming the memory cell array receives an erase pulse Vers that is generated by the internal voltage generation circuit 180 via a transistor TR, and the erase operation of the selected block is performed.

The erase operation of a NAND flash memory generally uses the ISPE method. The erase sequence of the ISPE is as shown in FIG. 5, an erase pulse P1 is applied, and then erase verification is performed. If it is unsatisfactory, an erase pulse P2 of a higher voltage than the previous erase pulse P1 is applied, and then erase verification is performed. If it is still unsatisfactory, an erase pulse P3 having a higher voltage than the previous erase pulse P2 is applied, and then erase verification is performed. When the number of erase pulses applied reaches an allowable maximum number or the erasing time reaches an allowable maximum time, the erase action times out, and the selection block is managed as a bad block.

In the first embodiment of the present invention, the voltage of the P well at the time of application of the first erase pulse P1 is detected, and it is determined whether or not the off-leakage current Ioff of the selection transistor Q is allowable based on the detected voltage. According to this determination result, the voltage of the source of the selection transistor Q or the voltage of the global word line GWLn is controlled.

FIG. 6(A) is a diagram showing an example of a rising waveform of the erase voltage applied to the P well when the off-leakage current Ioff of the selection transistor Q of the non-selected block is very small (or when the off-leakage current Ioff of the selection transistor Q is below the allowable value). FIG. 6(B) is a diagram showing an example of a rising waveform of the erase voltage applied to the P well when the off-leakage current Ioff of the selection transistor Q of the non-selected block is very large (or when the off-leakage current Ioff of the selection transistor Q exceeds the allowable value). When the off-leakage current Ioff of the selection transistor Q becomes large, the rise of the erase voltage of the P well becomes not steep.

In the present embodiment, the time point of the time Tjudge after a certain time from the time T at which the first erase pulse P1 is applied, and the threshold value for determining the magnitude of the off-leakage current Ioff are defined.

The voltage detection portion 200 detects the voltage Vjudge of the P well at the time point Tjudge after a certain time from the time T at which the first erase pulse P1 is applied. This detection result is provided to the controller 140. The controller 140 compares the voltage Vjudge of the P well with the threshold value. If the voltage Vjudge of the P well is lower than the threshold value, the rise of the erase voltage of the P well is slow, so it is determined that there is an off-leakage current Ioff that is higher than or equal to the allowable value flowing through the selection transistor Q (the example of FIG. 6(B)). On the other hand, if the voltage Vjudge of the P well is above the threshold value, the rise of the erase voltage of the P well is steep, so it is determined that there is no off-leakage current Ioff that is higher than or equal to the allowable value flowing through the selection transistor Q (the example of FIG. 6(A)).

When the controller 140 determines that the off-leakage current Ioff exceeding the allowable value flows, after the second erase pulse P2, the regulator 210 is controlled so that the voltage level of the global word line GWLn becomes higher than the previous one.

Furthermore, referring to FIG. 5, when the first erase pulse P1 is applied, the global word line GWLn is supplied with a lower voltage, such as GND (0V), by the regulator 210. During the period CHKPW in which the erase pulse P1 is applied, the controller 140 detects the voltage Vjudge of the P well, compares the detected voltage Vjudge with the threshold value, and determines whether the off-leakage current Ioff is above the allowable value.

If the voltage Vjudge of the P well is lower than the threshold value, the controller 140 controls the regulator 210 to make the voltage Vjudge of the P well to reach a higher voltage than the GND of the global word line GWLn, such as 0.5V, during the period in which the erase pulse P2 is applied after the erasing pulse P1, or during the erase period during which the erase pulse P1 is applied. Therefore, when a second or subsequent erase pulse is applied, the off-leakage current Ioff of the selection transistor Q of the non-selected block is suppressed, so that the rise of the erase voltage applied to the P well becomes steep as shown in FIG. 6(A). As a result, the erasing of the selected block becomes easy, and the reduction in the number of times the erasing pulse is applied or the shortening of the erasing time can be expected. However, if the voltage level of the global word line GWLn is excessively increased, it will become easy to cut the off-leakage current Ioff, but because the voltage difference between the control gate of the selected memory cell in the selected block and the P-well is also reduced, it is desirable that the rise of the voltage level of the global word line GWLn is suppressed to a certain value or less.

When the voltage Vjudge of the P well is below the threshold, the voltage level of the global word line GWLn is maintained, and the global word line GWLn is maintained at GND even when a second or subsequent erase pulse is applied.

In the above example, it is shown that when the voltage Vjudge of the P well is lower than the threshold value, the controller 140 changes the voltage level of the global word line GWLn to 0.5V when a second or subsequent erase pulse is applied, but the present invention is not limited thereto, and the controller 140 may change the voltage level of the global word line GWLn to 0.5V during the application of the initial erase pulse P1. In this case, the controller 140 controls the regulator 210 immediately during the application of the initial erase pulse P1 so that the voltage level of the global word line GWLn becomes higher than the original GND, and thus the voltage level of the global word line GWLn is adjusted during the application of the initial erase pulse P1.

Next, the second embodiment of the present invention will be described. In the above embodiment, the voltage level of the P-well is compared with a threshold value, so as to select the voltage level of the global word line GWLn between two values (0V or 0.5V). However, in the second embodiment, the voltage level of the P-well is compared with a plurality of threshold value, so as to correspondingly determine the optimal voltage of the global word line GWLn, that is, the source of the selection transistor Q of the non-selected block.

FIG. 7 shows an example of the relationship between the voltage Vjudge of the P well, the two threshold values Th1 and Th2 (Th1<Th2), and the voltage level of the global word line GWLn. When the voltage Vjudge of the P well is lower than the threshold value Th1, it is determined that the off-leakage current Ioff is large, and when the subsequent erase pulse is applied, the voltage of the regulator 210 is adjusted so that the voltage of the global word line GWLn becomes, for example, 0.5V. If the voltage Vjudge of the P well is above threshold value Th1 and lower than threshold value Th2, it is determined that the off-leakage current Ioff is slightly large, and when the subsequent erase pulse is applied, the voltage of the regulator 210 is adjusted so that the voltage of the global word line GWLn becomes, for example, 0.3V. If the voltage Vjudge of the P well is above the threshold Th2, it is determined that the off-leakage current Ioff is small, and when the subsequent erase pulse is applied, the voltage of the global word line GWLn is maintained at GND (0V).

Figure 8:
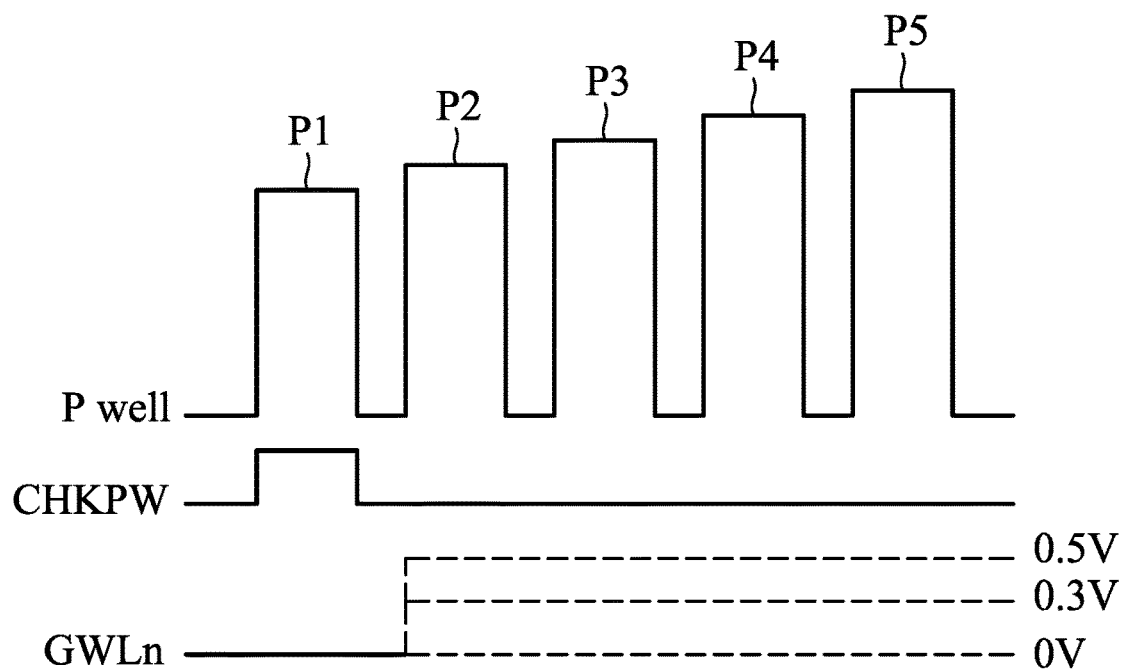
FIG. 8 is a diagram showing an erase sequence in accordance with the second embodiment of the present invention.

FIG. 8 shows the erase sequence of the second embodiment. As shown in FIG. 8, when the first erasing pulse P1 is applied, the voltage Vjudge of the P well and the threshold values Th1 and Th2 are compared. According to the comparison result, the voltage of the global word line GWLn is adjusted to 0V, 0.3V or 0.5V when a second or subsequent erase pulse is applied.

According to the second embodiment, by comparing the voltage Vjudge of the P well with the plural threshold values, the voltage level of the global word line GWLn can be adjusted in multiple stages. Thereby, the voltage level of the global word line GWLn can be optimized, and the bias difference of the erase voltage of the selected block can be kept constant while suppressing the off-leak current Ioff of the selection transistor Q of the non-selected block. Furthermore, in the above example, two threshold values are prepared in order to determine the voltage Vjudge of the P well. However, the present invention is not limited thereto. Three or more threshold values may be prepared, and the voltage level of the global word line GWLn can be finely adjusted in multiple stages.

Next, the third embodiment of the present invention will be described. In the first and second embodiments, the voltage Vjudge of the P well is detected when the initial erase pulse is applied by the ISPE, and according to the detection result, the voltage level of the global word line GWLn is adjusted when the subsequent erase pulse is applied. In the third embodiment, the voltage Vjudge of the P well is detected every time the erase pulse is applied, and according to the detection result the voltage level of the global word line GWLn is adjusted when the next erase pulse is applied.

Figure 9:
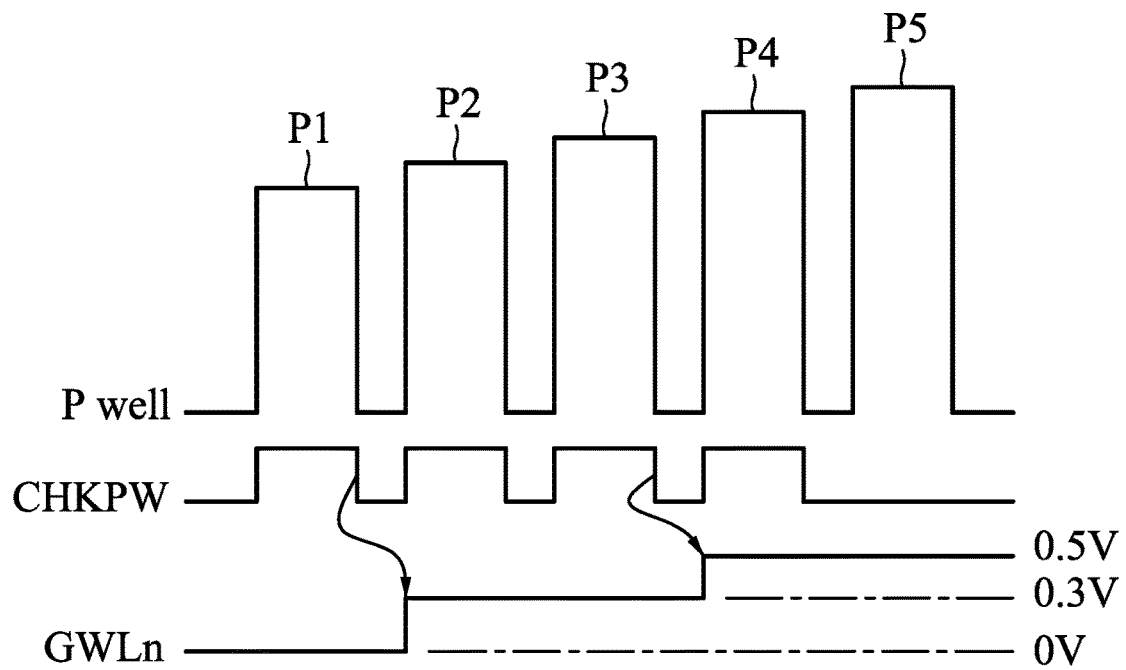
FIG. 9 is a diagram showing an erase sequence in accordance with the third embodiment of the present invention.

FIG. 9 shows an example of the erase sequence of the third embodiment. In the example of FIG. 9, according to the detection result of the voltage Vjudge of the P well when the erase pulse P1 is applied, the voltage of the global word line GWLn when the erase pulse P2 is applied is changed from 0V to 0.3V. According to the detection result of the voltage Vjudge of the P well when the erase pulse P3 is applied, the voltage of the global word line GWLn when the erase pulse P4 is applied is changed from 0.3V to 0.5V.

The off-leakage current Ioff of the selection transistor Q may vary due to the magnitude of the voltage of the erase pulse applied to the P well. As shown in the third embodiment, the magnitude of the off-leakage current Ioff is determined each time the erase pulse is applied, whereby the voltage of the global word line GWLn can be optimized in accordance with the voltage of the erase pulse.

Furthermore, in the above-described embodiments, the voltage detection portion 200 detects the voltage of the P well to determine the magnitude of the off-leakage current Ioff. However, the method of determining the magnitude of the off-leakage current Ioff is not limited thereto. For example, a current mirror circuit can be disposed in the regulator 210 to determine the off-leakage current Ioff by the current flowing through the current mirror circuit, and the voltage level of the global word line GWLn is adjusted when the next erase voltage is applied according to the determination result (for example, when the voltage of the global word line GWLn is 0V, all the off-leakage current Ioff is detected).

What is claimed is:

1. An erase method for NAND-type flash memory, comprising:
    based on address information, applying a first voltage to a gate of a first selection transistor connected to each word line of a memory cell to select a block, applying a second voltage to a gate of a second selection transistor connected to each word line of the memory cell to unselect a block, and applying a third voltage to a source/drain of the first and second selection transistors;
    detecting a voltage of a well region when an erase pulse is applied; and
    controlling the third voltage based on the detected voltage.

2. The erase method as claimed in claim 1, wherein the control of the third voltage comprises comparing the detected voltage and a threshold value, wherein when the detected voltage is lower than the threshold value the third voltage is increased.

3. The erase method as claimed in claim 2, wherein when the detected voltage is higher than the threshold value the third voltage is maintained.

4. The erase method as claimed in claim 1, wherein the detection of the voltage of the well region is performed after an initial erase pulse is applied, and the third voltage is adjusted during the application of the initial erase pulse.

5. The erase method as claimed in claim 1, wherein the detection of the voltage of the well region is performed after an initial erase pulse is applied, and the third voltage is adjusted when a second or subsequent erase pulse is applied.

6. The erase method as claimed in claim 1, wherein the detection of the voltage of the well region is performed after a plurality of erase pulses are applied.

7. An erase method for NAND-type flash memory, comprising:
   based on address information, applying a first voltage to a gate of a first selection transistor connected to each word line of a memory cell to select a block, applying a second voltage to a gate of a second selection transistor connected to each word line of the memory cell to unselect a block, and applying a third voltage to a source/drain of the first and second selection transistors;
   detecting off-leakage current of the selection transistor based on detecting a voltage of a well region when an erase pulse is applied; and
   controlling the third voltage based on the detected off-leakage current.

8. The erase method as claimed in claim 7, wherein the detection of the off-leakage current is performed after an initial erase pulse is applied, and the third voltage is adjusted when a second or subsequent erase pulse is applied.

9. The erase method as claimed in claim 1, wherein the control of the third voltage comprises comparing the detected voltage and a threshold value, wherein the third voltage is controlled based on the detection result.

10. A semiconductor memory device comprising:
    a memory cell array comprising a plurality of memory cells;
    a selection member comprising a selection transistor connected to each word line of the plurality of memory cells, wherein according to address information, the selection member applies a first voltage to a gate of a first selection transistor to select a block, and applies a second voltage to a gate of a second selection transistor to unselect a block;
    an erase member applying a third voltage to a source/drain of the first and second selection transistors, and applying an erase voltage to a well region to erase a selected block,
    wherein the erase member further comprises:
    a detection member detecting a voltage of the well region after the erase pulse is applied; and
    a control member controlling the third voltage based on the voltage detected by the detection member.

11. The semiconductor memory device as claimed in claim 10, wherein the control member increases the third voltage when the detected voltage is lower than a threshold value.

12. The semiconductor memory device as claimed in claim 10, wherein the control member maintains the third voltage when the detected voltage is higher than a threshold value.

13. The semiconductor memory device as claimed in claim 10, wherein the control member controls the third voltage when a subsequent erase voltage is applied.

14. The semiconductor memory device as claimed in claim 13, wherein the detection member detects the voltage of the well region after the initial erase pulse is applied.

15. The semiconductor memory device as claimed in claim 14, wherein the detection member detects the voltage of the well region every time one of a plurality of erasing pulses is applied.

16. The semiconductor memory device as claimed in claim 10, wherein the control member compares the detected voltage with a plurality of threshold values and controls the third voltage based on the comparison result.

\* \* \* \* \*